United States Patent [19]

Kravetsky et al.

[11] Patent Number: 4,957,713
[45] Date of Patent: Sep. 18, 1990

[54] APPARATUS FOR GROWING SHAPED SINGLE CRYSTALS

[76] Inventors: Dmitry Y. Kravetsky, ulitsa Bibliotechnaya, 13, kv. 91; Lev M. Zatulovsky, Orlikov pereulok, 8, kv. 55; Leonid P. Egorov, ulitsa Profsojuznaya, 75, korous 1, kv. 92; Boris B. Pelts, ulitsa Lesnaya, 63/43, kv. 157; Leonid S. Okun, ulitsa Udaltsova, 4, kv. 306; Efim A. Freiman, ulitsa 2-aya Vladimirovskaya, 15, korpus 1, kv. 53; Viktor V. Averyanov, ulitsa Energeticheskaya, 10, korpus 2, kv. 95; Alexandr L. Alishoev, Kronshtadtsky bulvar, 13, korpus 2, kv. 168, all of Moscow, U.S.S.R.

[21] Appl. No.: 241,978
[22] PCT Filed: Oct. 23, 1987
[86] PCT No.: PCT/SU87/00118
 § 371 Date: Jul. 20, 1988
 § 102(e) Date: Jul. 20, 1988
[87] PCT Pub. No.: WO88/03968
 PCT Pub. Date: Jun. 2, 1988

[30] Foreign Application Priority Data

Nov. 26, 1986 [SU] U.S.S.R. ............................. 4149059

[51] Int. Cl.⁵ ................................................ C30B 15/34
[52] U.S. Cl. ............................................ 422/249; 156/608; 156/617.1; 156/620.1; 156/620.5; 156/DIG. 61; 156/DIG. 88
[58] Field of Search ............... 156/608, 617.1, 620.1, 156/620.5, DIG. 61, DIG. 88; 422/249

[56] References Cited

U.S. PATENT DOCUMENTS

| | | | |
|---|---|---|---|
| 2,890,139 | 6/1959 | Shockley | 422/249 |
| 2,956,863 | 9/1960 | Goorissen | 422/249 |
| 3,298,795 | 1/1967 | Hamilton et al. | 422/249 |
| 3,715,194 | 2/1973 | Plooster | 156/DIG. 61 |
| 3,716,345 | 2/1973 | Grabmaier | 422/249 |
| 3,822,111 | 7/1974 | Suzuki et al. | 422/249 |
| 3,953,174 | 4/1976 | LaBelle | 156/120.1 |
| 4,000,030 | 12/1976 | Ciszek | 422/249 |
| 4,267,010 | 5/1981 | Bates et al. | 422/249 |
| 4,267,153 | 5/1981 | Taylor | 156/608 |
| 4,325,917 | 4/1982 | Pelts et al. | 422/249 |

Primary Examiner—Olik Chaudhuri
Assistant Examiner—Robert M. Kunemund
Attorney, Agent, or Firm—Burgess, Ryan & Wayne

[57] ABSTRACT

An apparatus for growing shaped single crystals of high-melting transparent metal compounds has a sealed chamber (1) having inside thereof a heat insulating unit (2) with a heater (3) in the form of a sleeve accommodating a crucible (5), mounted for axial reciprocations in the sleeve a shape-imparting member (6) in the form of a cylinder having capillary orifices for supplying a melt (11) from the crucible (5) to a crystallization zone (14) of a single crystal (7) located above an upper end (13) of the shape-imparting member (6) which is configured to have a cross-sectional shape of the single crystal (7). The heater also accommodates horizontally extending planar thermal shields (23) having coaxial openings (25) for the single crystal (7) being grown to pass therethrough, and a thermal shield (24) in the form of a hollow cylinder mounted in the openings of the planar thermal shields.

2 Claims, 1 Drawing Sheet

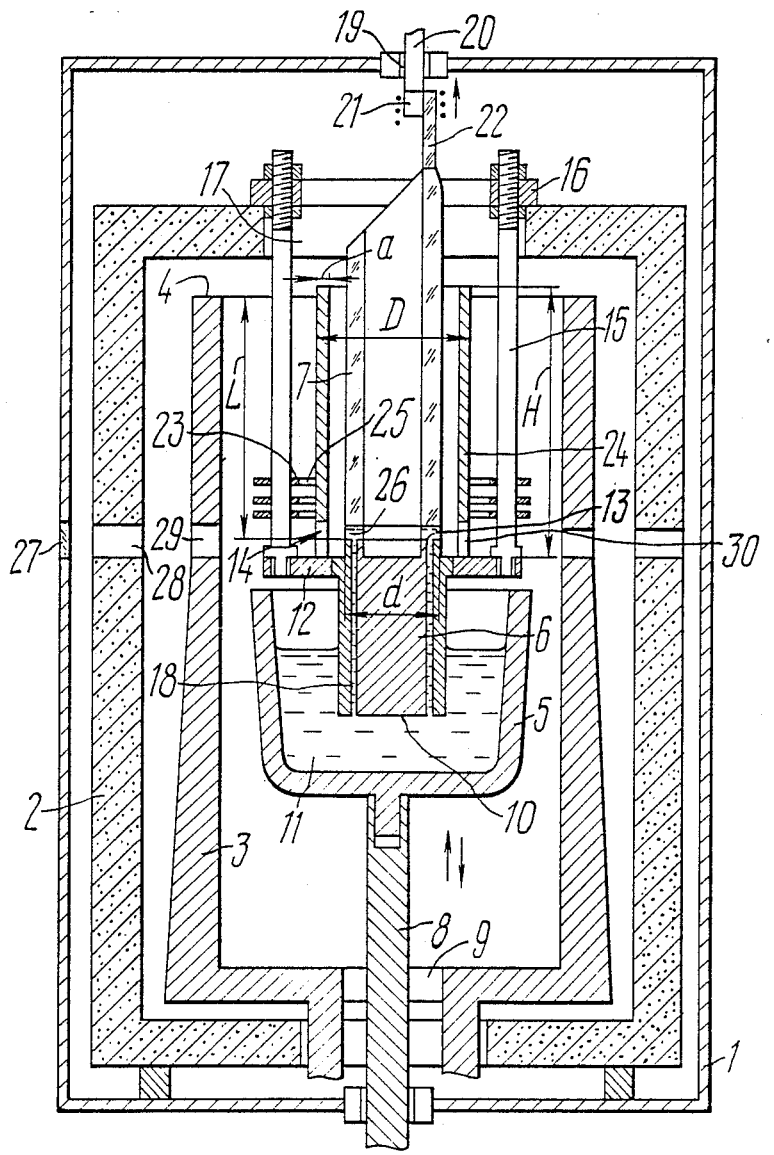

APPARATUS FOR GROWING SHAPED SINGLE CRYSTALS

FIELD OF THE INVENTION

The invention relates to the field of growing crystals from melts and deals with apparatus for growing single crystals of high melting transparent metal compounds, and more particularly, with an apparatus for growing shaped single crystals.

PRIOR ART

Very stringent requirements are imposed upon quality of profiled single crystals. The main quality characteristics are dimensional accuracy, electrical breakthrough strength, integral light transmission, crystallographic disorder of orientation of single crystal blocks, and mechanical strength. Thus it is specified for a tubular single crystal of that it should have a dimensional tolerance of ±0.2 mm in diameter, electrical breakthrough strength of −50 kV/mm and integral light transmission more than 92%.

The main factor influencing the quality of single crystals is the character of a temperature field in the melt/single crystal system which depends on the configuration and relative position of thermal shields ensuring thermal screening of the single crystal.

Known in the art is an apparatus for growing shaped single crystals of high-melting transparent metal compounds (P. I. Antonov et al. Producing Shaped Single Crystals by the Stepanov Method. 1981, Nauka, Leningrad, pp. 137-142), comprising a sealed chamber accommodating a heat insulating untit having a heater in the form of a sleeve in which there is mounted a crucible which is installed for axial reciprocations in the sleeve, a shape-imparting member in the form of a cylinder having through capillary orifices for supplying melt from the crucible into the single crystal crystallization zone located above the upper end of the shape-imparting member which is configured to have the cross-sectional shape of the single crystal being grown and which is disposed below the upper extremity of the heater, and planoar hyorizontally extending thermal shields having coaxila openings for the passage of the single crystal being grown therethrough.

The thermal shields are designed for providing a desired temperature gradient lengthwise of the single crystal during both growing and cooling. In addition, the thermal shields are designed for making temperature distribution uniform in the zone of crystallization of the single crystal.

The planar thermal shields are made of a high-melting material in the form of rings each 0.5 to 1 mm thick and are stacked, with 10 to 20 pieces in one stack. A clearance between adjacent shields is at least 5 times as great as their thickness. About one half of the shields are disposed inside the heater, the rest of the shields being installed above the heater. The amount of clearances between the shields and the heater and the single crystal, repectively, does not exceed two times the thermal shield thickness. A temperature gradient of 20° to 30° C./cm can be ensured in an apparatus for growing shaped single crystals using such thermal shields.

This temperature gradient lengthwise of the grown portion of a single crystal lowers the stability of the pulling process, i.e. even under low temperature fluctuations in the crystallization zone the height of the melt column deviates from the desired value so as to cause a change in the cross-sectional dimensions of the single crystal being grown, thus lowering the yield of normal-grade crystals.

It should be noted that it is practically impossible to ensure a constant temperature both in the crystallization zone of a single crystal and at the upper end of the shape-imparting member using such thermal shields owing to inaccurcies in the assembly and installation of the stack of thermal shields before each production cycle of growing of a new single crystal. In addition, the extremities of the planar thermal shields which are located adjacent to the heater surface are overheated. This results in warping of the thermal shields and also in undesired physico-chemical reactions between the metal, e.g. molybdenum of which components of the apparatus are made and carbon evaporating from the heater surface and also impurities present in an inert gas used as an atmosphere for the production process of single crystal growth. Gaseous products relsulting from the reactions get into the melt and single crystal thus causing deterioration of the optical properties of the single crystal.

DISCLOSURE OF THE INVENTION

The invention is based on the problem of providing an apparatus for growing shaped single crystals of high-melting transparent metal compounds having such thermal shielding which ensures improved dimensional accuracy of single crystals being grown, hence, a higher yield of normal grade single crystals owing to a better temperature uniformity at the upper end of the shape-imparting member.

This problem is solved by that an apparatus for growing shaped single crystals of high-melting transparent metal compounds, comprising a sealed chamber housing a heat insulating unit with a heater in the form of a sleeve accommodating a crucible mounted for axial reciporocations in the sleeve, a shape-imparting member in the form of a cylinder having through capillary orifices for supplying melt from the crucible into a single crystal crystallization zone located above the upper end of the shape-imparting member which is configured to have a cross-sectional shape of the single crystal being grown and which is located below the upper extremity of the heater, and horizontally extending planar thermal shields having coaxial openings for the single crystal being grown to pass therethrough, according to the invention, also comprises an auxiliary thermal shield in the form of a hollow cylinder extending in the openings of the thermal shields coaxially therewith.

It is preferred that the height of the hollow cylinder be from 1 to 1.6 times the distance from the upper end of the shape-imparting member to the upper extremity of the heater and the thickness be from 0.1 to 0.15 times, and the outside diameter from 1.5 to 2.0 times the diameter of a circle described about the upper end of the shape-imparting member.

The provision of the auxiliary thermal shield made in the form of a hollow cylinder of a heat conducting material makes it possible to ensure such temperature distribution at the upper end of the shape-imparting member that maximum temperature differential do not exceed 3° C. It should be noted that a temperature gradient of from 120° to 160° C./cm is ensured lengthwise of the single crystal being grown inside the heater, and a temperature differential does not exceed 3° C. in various sections of the single crystal growth at different distances from the crystallization front thus bringing about a better stability of crystal growth.

Shaped single crystal with a cross-sectional dimensional stability of ±0.05 mm may be produced, and the yield of normal grade shaped single crystals may be increased by 35–40% with the use of the apparatus for growing shaped single crystals according to the invention.

BRIED DESCRIPTION OF DRAWINGS

The invention will now be described in detail with reference to a specific embodiment illustrated in the accompanying drawing, in which a schematic general view is shown of an apparatus for growing shaped single crystals of high-melting transparent metal compounds according to the invention, in a longitudinal section.

DETAILED DESCRIPTION OF THE INVENTION

An apparatus for growing shaped single crystals of high-melting transparent metal compounds will be described as applied to an application for growing a tubular single crystal. It comprises a sealed chamber 1 in which there is mounted a heat insulating unit 2 made of graphite and graphite impregnated fabric. A resistance heater 3 mounted in the unit 2 is made out of graphite in the form of a sleeve having a bottom wall connected to a power supply (not shown in the FIGURE).

The wall thickness of the heater 3 is not constant vertically thereof. The heater wall is of a uniform thickness up to about ⅓ of the height of the heater 3 as measured from its upper extremity 4, and the wall thickness increases along the rest of the heater 3, the wall thickness in the area adjacent to the bottom wall being about 1.3 times as great as its thickness adjacent to the upper extremety 4.

A crucible 5 and as shape-imparting member 6, which is designed for forming a leucosupphire single crystal 7 in the form of a tube, are installed inside the heater 3 coaxially therewith.

The crucible 5 is made of molybdenum: it is conical in shape and has a polished inner surface. The height of the crucible 5 is about ⅓ times a s great as the height of the heater 3. The crucible 5 is mounted for axial reciprocations in the heater 3. The crucible is secured to a rod 8 which extends through a hole 9 in the bottom wall of the heater 3.

The crucible 5 is shown in the drawing in the upmost position at which the single crystal 7 is grown. In this position the shape-imparting member 6 is in the middle part of the heater 3 and its lower end 10 is submerged in a melt 11 of a high-melting transparent metal compound which is aluminium oxide melt in this example. In its lowermost position the crucible 5 (not shown) is directly adjacent to the bottom wall of the heater 3. Charging and melting of a starting material of a high-melting metal compound of which the single crystal 7 is to be grown are carried out in this position.

The shape-imparting member 6 is mounted on a flange 12 disposed in the middle part of the heater 3. To prolong service life of the flange 12, its diameter should not exceed the diameter of the crucible 5. An upper end 13 of the shape-imparting member 6 is located below the upper extremity 4 of the heater 3 by about ⅓ times the height of the heater 3. A zone 14 of crystallization of the single crystal 7 is located above the upper end 13 of the shape-imparting member 6. The flange 12 is mounted on drew bars 15 having their ends threaded to a ring 16 which partly covers an opening 17 in the upper part of the heat unsulating unit 2.

The shape-imparting member 6 is made of a material wettable with the melt of a high-melting metal compound, e.g. of molybdenum. It is designed for supplying the melt 11 from the crucible 5 through a capillary system into the crystallization zone 14 in which a predetermined profile of the single crystal 7 is formed. In this embodiment the shape-imparting member 6 has a capilliary system in the form of an annular space 18 for forming an annular profile of the single crystal 7. Maximum diameter of the single crystal 7 is 0.01–0.02 mm smaller than the maximum diameter of the upper end 13 of the shape-imparting member 6 and minimum diameter of the single crystal 7 is 0.05–0.1 mm greater than the minimum diameter of the upper end 13 of the shape-imparting member 6.

An opending 19 is provided in the upper part of the sealed chamber 1, and a rod 20 passes through this opening. A seed cystal holder 21 carrying a single crystal seed 22 is secured to the end of the rod 20.

For optimizing temperature conditions of growth of the single crystal 7, the apparatus in this embodiment comprises three planar thermal shields 23. The planar thermal shields 23 extend horizonally above the flange 12 and are designed for reducing heat losses in the crystallization zone 14. The thermal shields 23 are made of molybdenum and are in the form of planar rings 1 mm thick. The clearance between the rings is 6 mm.

In addition, there is provided a thermal shield 24 which is designed for ensuring uniform temperature distribution along the perimeter of the single crystal in any section thereof. This thermal shield is in the form of a hollow cylinder made of molybdenum and has one end thereof secured to the flange 12 coaxially with the single crystal 7 being grown. The thermal shield 24 extends in openings 25 of the planar thermal shields 23 which are designed for the single crystal 7 being grown to pass therethrough.

In the embodiment of the apparatus shown in the drawing the planar thermal shields 23 are secured by means of pins (not shown in the drawing) to the outer surface of the thermal shield 24.

The heifht H of the thermal shield 24 is from 1 to 1.6 times as great as the distance L from the upper end 13 of the shape-imparting member 6 to the upper extremity 4 of the heater 3. With a smaller height H of the shield 24 the temperature gradient in the single crystal 7 increases thus causing a substantial deterioration of its structure and resulting in a deposition of molybdenum, carbon, aluminium and ox ygen compounds on the surface thereof thus lowering the yield of normal grade single crystals. If the height H of the thermal shield 24 is greater than 1.6L, the structure of the single crystal 7 cannot be substantially improved.

The outsidee diameter D of the thermal shield 24 should range from 1.5 to 2.0 times the diameter d of a circle described about the upper end 13 of the shape-impartinhg member 6 if the single crystal 7 is grown to have a cross-sectional configuration of a triangle, hexagon or trapezium. In the simplest application the thermal shield 24 may be in the form of a ring, triangle, hexagon or in the form configured to conform to the cross-sectional configuration of the single crystal 7 being grown. If the single crystal 7 is grown in the form of a tube, its diameter d is equal to the diameter of the upper end 13 of the shape-imparting member 6.

The thickness a of the thermal shield 24 should range from 0.1 to 0.15 times the outside diameter D of the single crystal 7.

If the diameter D of the shield 24 is smaller than 1.5d and its thickness h is smaller than .01d or greater than 0.15d, no temperature uniformity outside the single crystal 7 can be ensured.

For visual observation of the state of a melt column 26 in the crystallization zone 14 and for subsequent adjustment of conditions under which the single crystal 7 is grown, a window 27 is provided at the level of the upper end 13 of the shape-imparting member 6 in the sealed chamber 1, and openings 28, 29 and 30 are provided in the heat insulating unti 2 and in the heater 3 and thermal shield 24, respectively, coaxially with the window and on either side of the single crystal 7.

The apparatus for growing shaped single crystals of high-melting transparent metal compounds according to the invention functions in the following manner.

The crucible 5 is brought to the upmost position in the heater 3 by moving the rod 8; and a starting material in the form of randomly shaped lumps of aluminium oxide is charged therein through the opening 17 of the heat insulating unit 2. Then the crucible 5 is moved by the rod 8 to the lowermost position (not shown in the drawing), and the flange 12 assembled with the shape-imparting member 6 and the thermal shields 23 and 24 is installed in the heater 3.

After sealing the chamber and its evacuation to $6.7 \cdot 10^{-3}$ Pa, roasting is carried out. Then voltage is applied to the heater 3 and, under the action of heat released by the heater 3, the crucible 5 containing the starting material and the shape-imparting members 6 are heated to 1300° to 1500° C. and are allowed to stay at this temperature during 20 to 40 minutes so as to degas the apparatus. The heating temperature is monitored, e.g. by means of a pyrometer. The chamber 1 is then filled up with an inert gas, preferably with argon, under a pressure from $9.8 \cdot 10^4$ to $10.79 \cdot 10^4$ Pa. The starting material is melted in the crucible 5 and the crucible 5 containing the melt 11 is then moved into the upmost position, first until it comes in touch with the lower end 13 of the shape-imparting member 6 and then to the working position in which the distance from the surface of the melt 11 in the crucible 5 to the upper end 13 of the shape-imparting member 6 is about 20 mm. The melt 11 is supplied through the space 18 from the crucible 5 into the crystallization zone 14.

The rod 20 is then lowered until the seed crystal 22 comes in touch with the end 13 of the shape-imparting member 6, and the seed crystal 22 is fused. A melt column 26 which is 0.2 to 0.3 mm high thus forms between the seed crystal 22 and the end 13 of the shape-imparting member 6. Then the single crystal 7 is grown to have a desired cross-section. The growth is initially carried out by moving the rod 20 carrying the seed crystal 22 at a rate of 0.5 to 1 mm/min.

During the initial growth the melt column 26 is shaped into a closed ring at the end 13 of the shape-imparting member 6. The single crystal 7 is then pulled from the crystallaziation zone 14 by moving the rod 20 up at a rate from 1 to 5 mm/min.

During fusion of the seed crystal 22, initial growth and pulling of the single crystal 7, visual observation of the state of the melt column 26 in the crystallization zone 14 is conducted. If the shape of the melt column 26 deviates from the desired configuration, the heating temperature in the heater 3 is varied by varying its power.

In pulling the single crystal 7 (and it can be better seen in growing large-diameter single crystals or in growing a cluster of single crystals at a time) the thermal shield 24 ensures a uniform temperature distribution in any section of the single crystal 7 owing to a high heat conductance of molybdenum of which it is made. In addition, owing to the provision of a large enough clearance between the single crystal 7 and the shield 24 a temperature gradient in the crystallization zone 14 is between 120° and 160° C./cm so that single crystals with exact cross-sectional dimensions can be produced (±0.05 mm lengthwise).

When the predetermined lenght of the single crystal 7 is grown, it is broken off the melt column 26, e.g. by lowering the crucible 5. The single crystal 7 is then cooled down to 1550° to 1600° C. at a rate of 20° to 30° C./min by lowering the power output of the heater 3.

When a temperature between 1550° and 1600° C. is achieved, the heater 3 is deenergized and further cooling of the single crystal 7 to the ambient temperature (20° C.) is carried out naturally.

INDUSTRIAL APPLICABILITY

An apparatus for growing shaped single crystals may be used for producing single crystals of various high-melting transparent metal compounds such as leucosapphire, ruby, scandium oxide, alumo-yttrium garnet melting at about 2000° C. which require substantially no machining and which are widely used in the instrumentation engineering, chemistry, metallurgy and in other industries as components of chemical equipment, lighting and optical devices, equipment of oil wells, components of containers for the synthesis and analysis of high purity alloys and also as blanks for jewelry articles.

We claim:

1. An apparatus for growing shaped single crystals of high-melting transparent metal compounds, comprising a sealed chamber housing, a heat insulating unit with a heater in the form of a sleeve accommodating a crucible mounted for axial reciprocations in the sleeve, a shape imparting member in the form of a cylinder having through capillary orifices for supplying a melt from the crucible into a zone of crystallization of a single crystal located above an upper end of the shape-imparting member which is configured to have a cross-sectional shape of the single crystal being grown and which is located below an upper extremity of the heater, and horizontally extending planar thermal shields having coaxial openings for the single crystals being grown to pass therethrough, and an auxiliary thermal shield in the form of a hollow cylinder comprised of a material having a high melting point, said thermal shield extending in the openings of the planar thermal shields coaxially therewith, said thermal shield being situated in close proximity with a crystallization front of said crystal.

2. An apparatus for growing shaped single crystals according to claim 1, the height of the hollow cylinder is from 1 to 1.6 times as great as the distance from the upper end of the shape-imparting member to the upper extremity of the heater, in that its thickness is from 0.1 to 0.15 times, and its outside diameter from 1.5 to 2.0 times as great as the diameter of a circle described about the upper end of the shape-imparting member.

* * * * *